United States Patent
Saeki

[19]

[11] Patent Number: 6,029,963

[45] Date of Patent: Feb. 29, 2000

[54] SEMICONDUCTOR MEMORY DEVICE HAVING NOVEL LAYOUT PATTERN

[75] Inventor: Takanori Saeki, Tokyo, Japan

[73] Assignee: NEC Corporation, Tokyo, Japan

[21] Appl. No.: 09/003,714

[22] Filed: Jan. 7, 1998

[30] Foreign Application Priority Data

Jan. 13, 1997 [JP] Japan ................................... 9-003539

[51] Int. Cl.[7] ................................................ H01L 29/76
[52] U.S. Cl. ............................ 267/369; 257/509; 257/544
[58] Field of Search ........................... 365/182; 438/223, 438/224, 228; 257/369, 544, 509

[56] References Cited

U.S. PATENT DOCUMENTS 5,668,755   9/1997   Hidaka ..................................... 365/162

OTHER PUBLICATIONS

S. Fujii et al., "A 45ns 16Mb DRAM with Triple–Well Structure", 1989 ISSCC Digest Technical Papers, Feb. 1989, pp. 248–249.

Primary Examiner—Sara Crane
Attorney, Agent, or Firm—Suhrue, Mion, Zinn, Macpeak & Seas, PLLC

[57] ABSTRACT

A semiconductor memory device laid out to have a deep well of a second conductivity type formed in a semiconductor substrate of a first conductivity type, a cell array well of the first conductivity type formed on said deep well, and an isolation well of the second conductivity type formed around said cell array well to reach said deep well so as to incorporate said cell array well, thereby isolating said cell array well from said semiconductor substrate through said isolation well, wherein a circuit element for driving said cell array is formed in said isolation well.

4 Claims, 8 Drawing Sheets

SEMICONDUCTOR MEMORY DEVICE HAVING NOVEL LAYOUT PATTERN

BACKGROUND OF THE INVENTION

1. Field of the Invention

The present invention relates to a semiconductor memory device and, more particularly, to the layout pattern of a DRAM (Dynamic Random Access Memory).

2. Description of the Prior Art

For a conventional DRAM having memory cells each constituted by one transistor and one capacitor, a technique of isolating a well for the formation of a memory cell from a well for the formation of a specific element as a peripheral circuit has been proposed to protect the memory cell region against noise from the peripheral circuit region. According to this technique, a so-called triple-well structure has been used. FIGS. 1 and 2 show an example of this structure, which is disclosed in Syuso Fuji et al., 1989 ISSCC DIGEST TECHNICAL PAPERS pp. 248–249 1989, February. FIG. 1 is a plan view of the structure. FIG. 2 is a sectional view taken along a line II—II in FIG. 1. A plurality of isolated P-type wells 303 are formed in an N-type substrate 301. A memory cell array 311 and an NMOS element 313 of a sense amplifier 312 are formed in each P-type well 303. In addition, a PMOS element 314 of the sense amplifier 312 and a peripheral PMOS element 315 of a power supply VCC are formed on the N-type substrate 301. P-type wells 305 and 306 are formed in the N-type substrate 301. An N-type well 307 is formed in the P-type well 306 to form a triple-well. A PMOS element 316 of a power supply VBOOT is formed in this triple-well. An NMOS element 317 as a peripheral circuit is formed in the P-type well 305. With this structure, the memory cell array 311 formed in the P-type well 303, the sense amplifier 312, and the peripheral circuit are electrically isolated from each other.

FIG. 3 is a plan view showing another structure. FIG. 4 is a sectional view taken along a line IV—IV in FIG. 3. As shown in FIGS. 3 and 4, a deep N-type well 402 is formed in a predetermined region of a P-type substrate 401, and a P-type well 403 is formed on the N-type well 402. In addition, the periphery of the P-type well 403 is surrounded by an N-type well 404 reaching the deep N-type well 402 to isolate the P-type well 403 from the P-type substrate 401. A memory cell array 411 constituting a cell array, and an NMOS element 413 of a sense amplifier 412 are formed in the P-type well 403. In addition, an N-type well 404A is formed in a portion of the P-type well 403. A PMOS element 414 of the sense amplifier 412 is formed in the N-type well 404A. An NMOS element 417 is directly formed on the portion, of the P-type substrate 401, which is located around the N-type well 404. A PMOS element 415 of a power supply VCC and a PMOS element 416 of a power supply VBOOT are respectively formed in N-type wells 405 and 406. In this structure, the memory cell array 411, the sense amplifier 412, and the peripheral circuit are isolated from each other through the N-type well 404.

Of these conventional structures, the structure shown in FIGS. 1 and 2 requires a triple-well structure to form the PMOS element 316 of the power supply VBOOT. The area of the isolation P-type well 306 is large as compared with the area of the element to be formed, thus posing a problem in realizing a high integration degree. In the structure shown in FIGS. 3 and 4, after the N-type well 404A for the formation of the PMOS element 414 of the sense amplifier 412 is formed in the P-type well 403, the N-type well 404 is formed around the N-type well 404A to isolate the P-type well 403 from the substrate 401. This structure therefore demands an extra area corresponding to the region for the formation of the N-type well 404A, in addition to the distance required between the two N-type wells 404A and 404, posing a problem in realizing a high integration degree.

SUMMARY OF THE INVENTION

The present invention has been made to solve the above problems in the prior art, and has as its object to provide a semiconductor memory device which has a novel layout pattern that reduces the area occupied by an isolation well in a triple-well structure and can realize a high integration degree.

In order to achieve the above object, according to the first aspect of the present invention, there is provided a semiconductor memory device laid out to have a deep well of a second conductivity type formed in a semiconductor substrate of a first conductivity type, a cell array well of the first conductivity type formed on the deep well, and an isolation well of the second conductivity type formed around the cell array well to reach the deep well so as to incorporate the cell array well, thereby isolating the cell array well from the semiconductor substrate through the isolation well, wherein a circuit element for driving the cell array is formed in the isolation well.

According to the second aspect of the present invention, in the first aspect, a memory cell and a second conductivity type channel element of a sense amplifier circuit are formed in the cell array well, and a first conductivity type channel element of the sense amplifier circuit is formed in the isolation well.

According to the third aspect of the present invention, in the first aspect, a memory cell is formed in the cell array well, a first conductivity type channel element of the sense amplifier circuit is formed in the isolation well, and a second conductivity type channel element of the sense amplifier circuit is formed in a region, of the semiconductor substrate, which is located outside the isolation well.

According to the fourth aspect of the present invention, in the first aspect, at least another well of the second conductivity type is formed in a region, of the semiconductor substrate, which is located outside the isolation well, a first conductivity type channel element of a peripheral circuit is formed in the well, and a second conductivity type channel element of a peripheral circuit is formed in a region, of the semiconductor substrate, which is adjacent to the another well.

According to the present invention having the above aspects, since some of the elements constituting the sense amplifier circuit are formed in the isolation well which is formed to isolate the well for the formation of a memory cell from the semiconductor substrate, the isolation well can be effectively used as a portion of the circuit. In the present invention, even if the cell array region is isolated from the semiconductor substrate in the triple-well structure, an increase in chip size can be minimized, and a semiconductor memory device with a high integration degree can be realized.

The above and many other advantages, features and additional objects of the present invention will become manifest to those versed in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Figure 1:
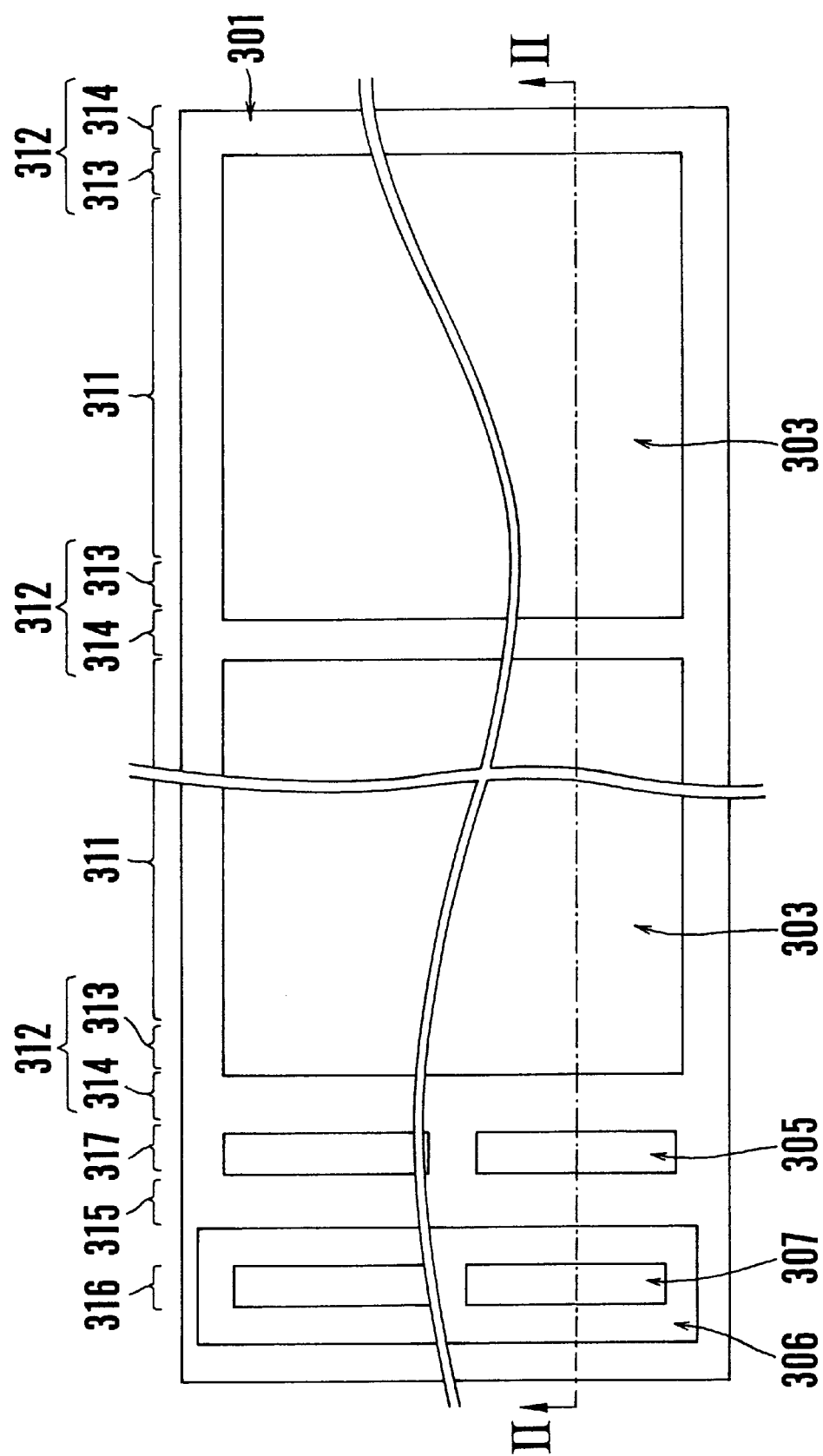
FIG. 1 is a plan view showing the layout of a conventional device.
Figure 2:
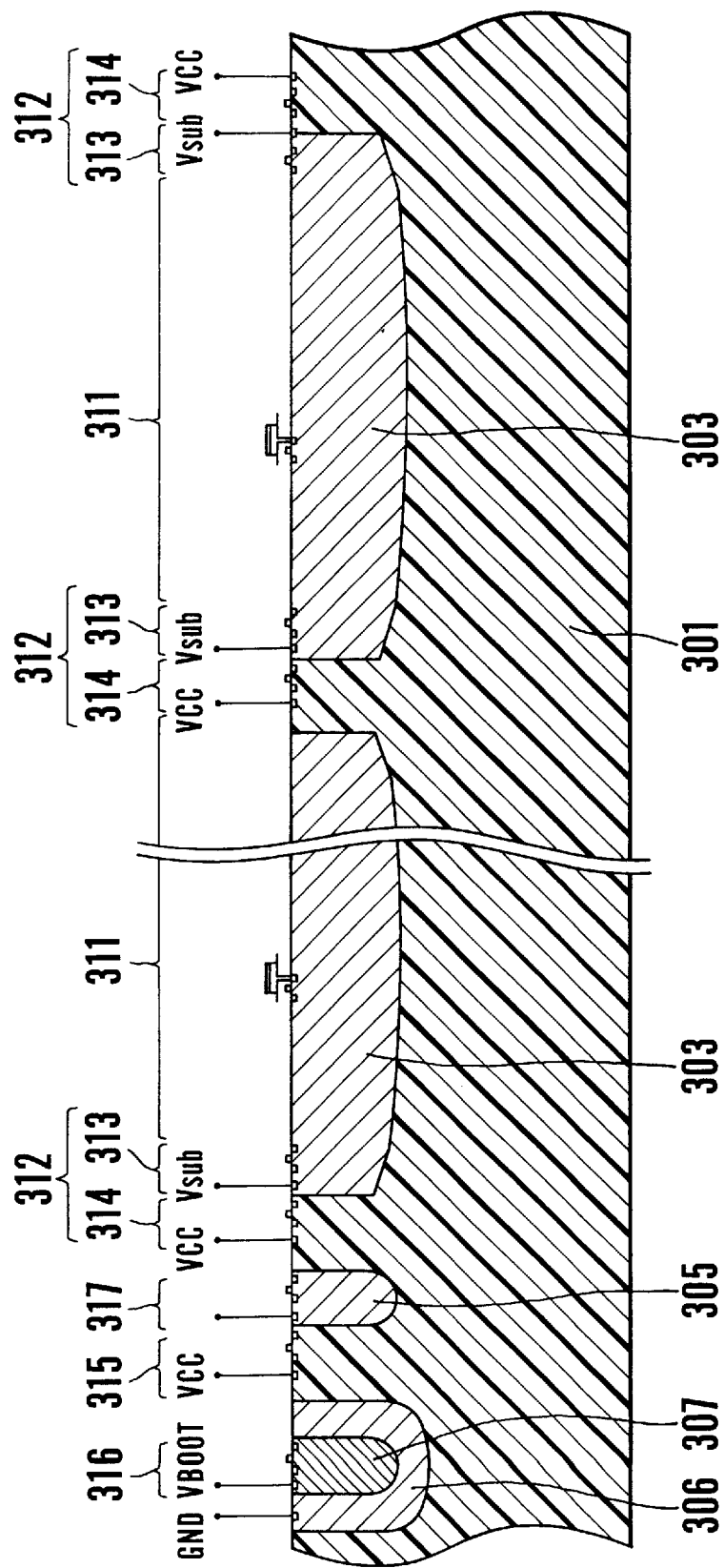
FIG. 2 is a sectional view taken along a line II—II in FIG. 1.
Figure 3:
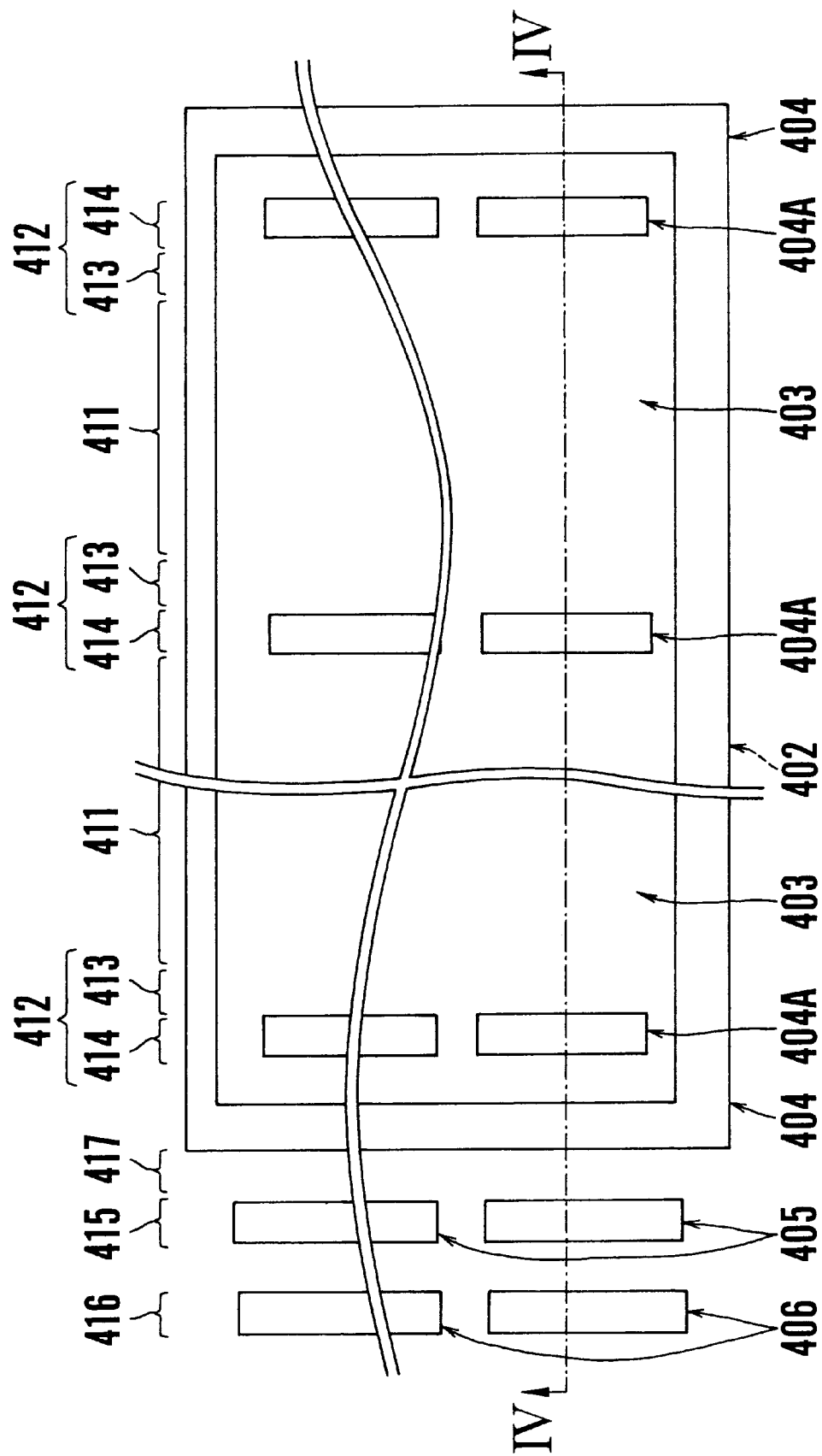
FIG. 3 is a plan view showing the layout of another conventional device.
Figure 4:
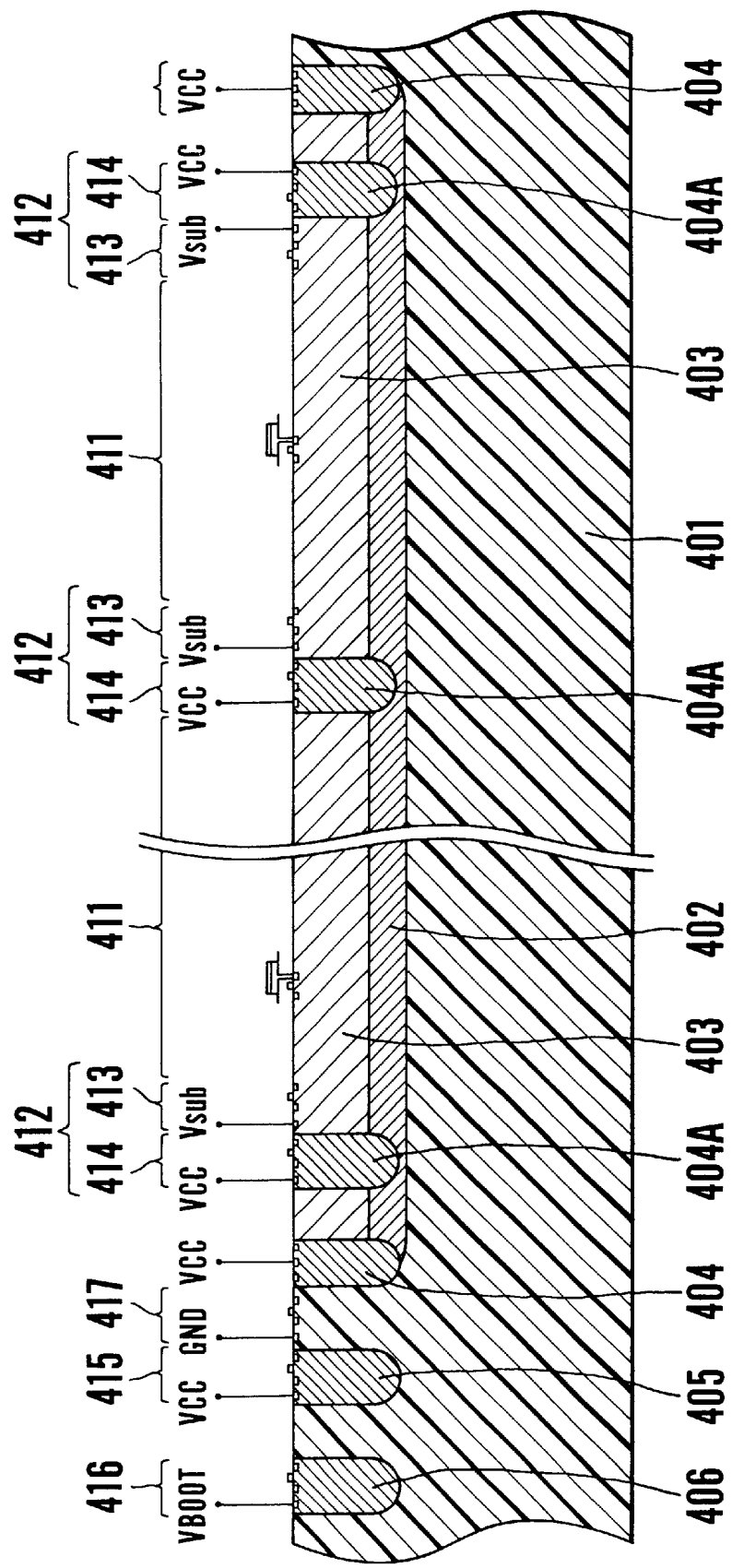
FIG. 4 is a sectional view taken along a line IV—IV in FIG. 3.
Figure 5:
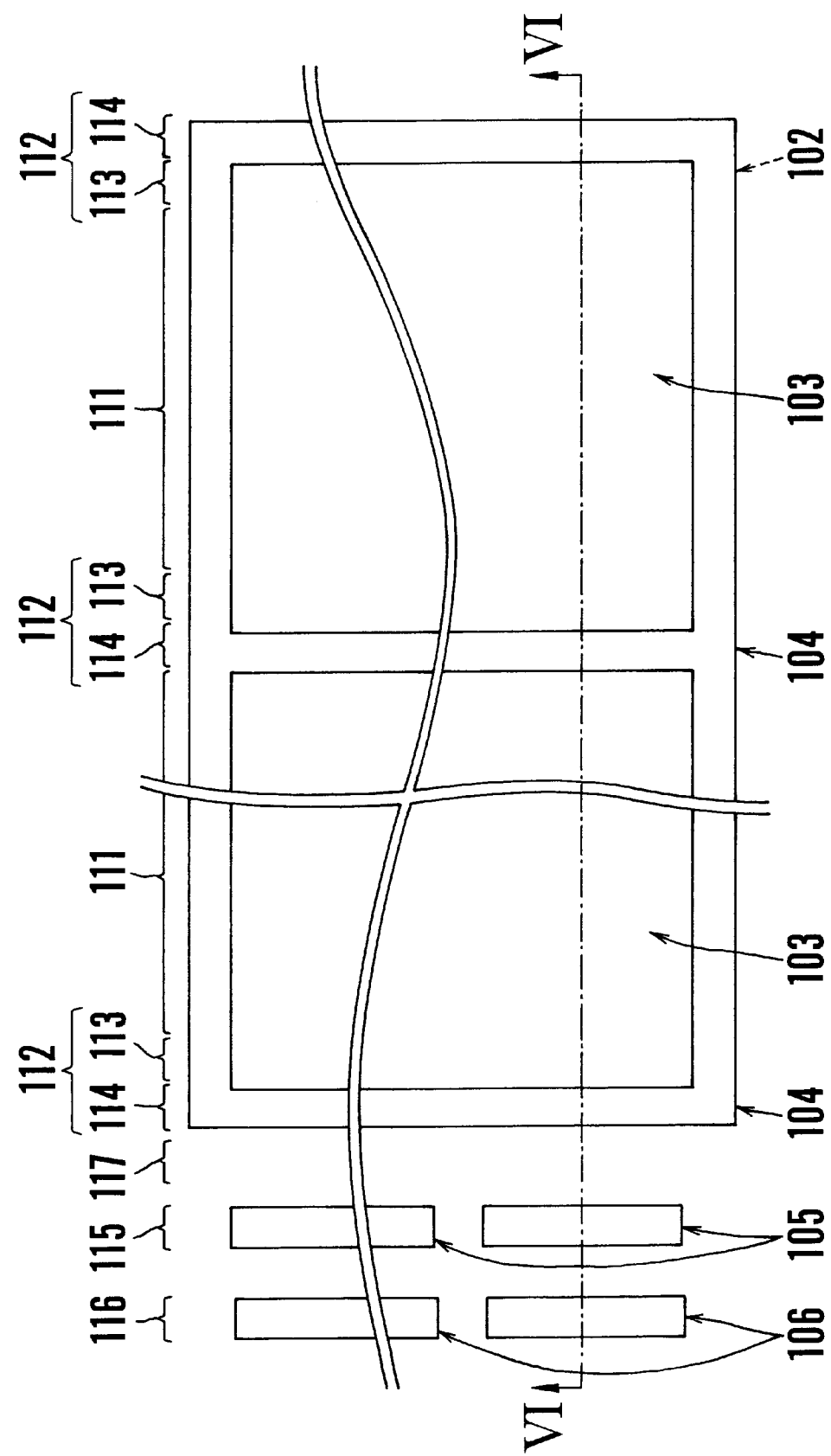
FIG. 5 is a plan view showing the layout of the first embodiment of the present invention.
Figure 6:
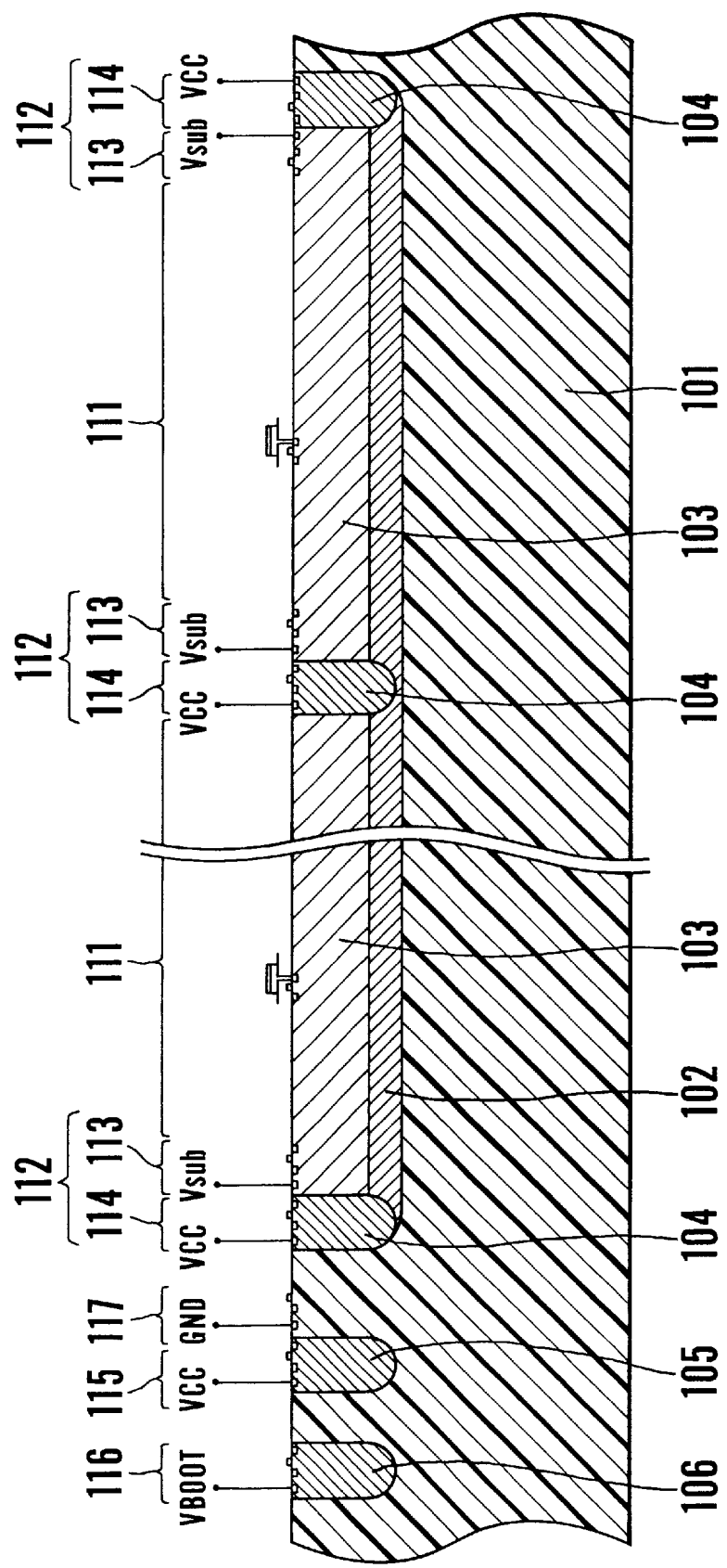
FIG. 6 is a sectional view taken along a line VI—VI in FIG. 5.

Several preferred embodiments of the present invention will be described below with reference to the accompanying drawings. FIGS. 5 and 6 are a plan view of the first embodiment of the present invention and a sectional view taken along a line VI—VI therein, respectively. Referring to FIGS. 5 and 6, a deep N-type well 102 is formed in a cell array formation region of a semiconductor substrate 101. A P-type well 103 is formed in this deep N-type well 102. In addition, an isolation N-type well 104 reaching the deep N-type well 102 is formed along the periphery of the P-type well 103. The P-type well 103 and the semiconductor substrate 101 are isolated from each other through the isolation N-type well 104. A memory cell 111 and a sense amplifier 112 are formed in the P-type well 103. The sense amplifier 112 is constituted by an NMOS element 113 made of an NMOS flip-flop such as an NMOS transfer gate or a chip select gate and a PMOS element 114 made of a PMOS flip-flop. Of these elements, the PMOS element 114 is formed in the isolation N-type well 104 formed along the periphery of the P-type well 103. The NMOS element 113 is formed in the portion, of the P-type well 103, which is adjacent to the isolation N-type well 104.

N-type wells 105 and 106 are formed in the region, of the semiconductor substrate 101, which is adjacent to the isolation N-type well 104. A PMOS element 115 as a peripheral circuit of a power supply VCC is formed in the N-type well 105. A PMOS element 116 of a power supply VBOOT is formed in the N-type well 106. An NMOS element 117 as a peripheral circuit is directly formed on the semiconductor substrate 101.

In this embodiment, therefore, of the NMOS element 113 and the PMOS element 114 which constitute the sense amplifier 112 connected to the memory cell, the PMOS element 114 is formed in the N-type well 104 for isolating the P-type well 103 from the semiconductor substrate 101. For this reason, the isolation N-type well 104 can also be used as an element region. With this structure, the isolation N-type well 104 can be effectively used. With this N-type well 104, the problem of an wasteful area on the semiconductor substrate 101 can be solved. The integration degree of elements can therefore be increased.

Figure 7:
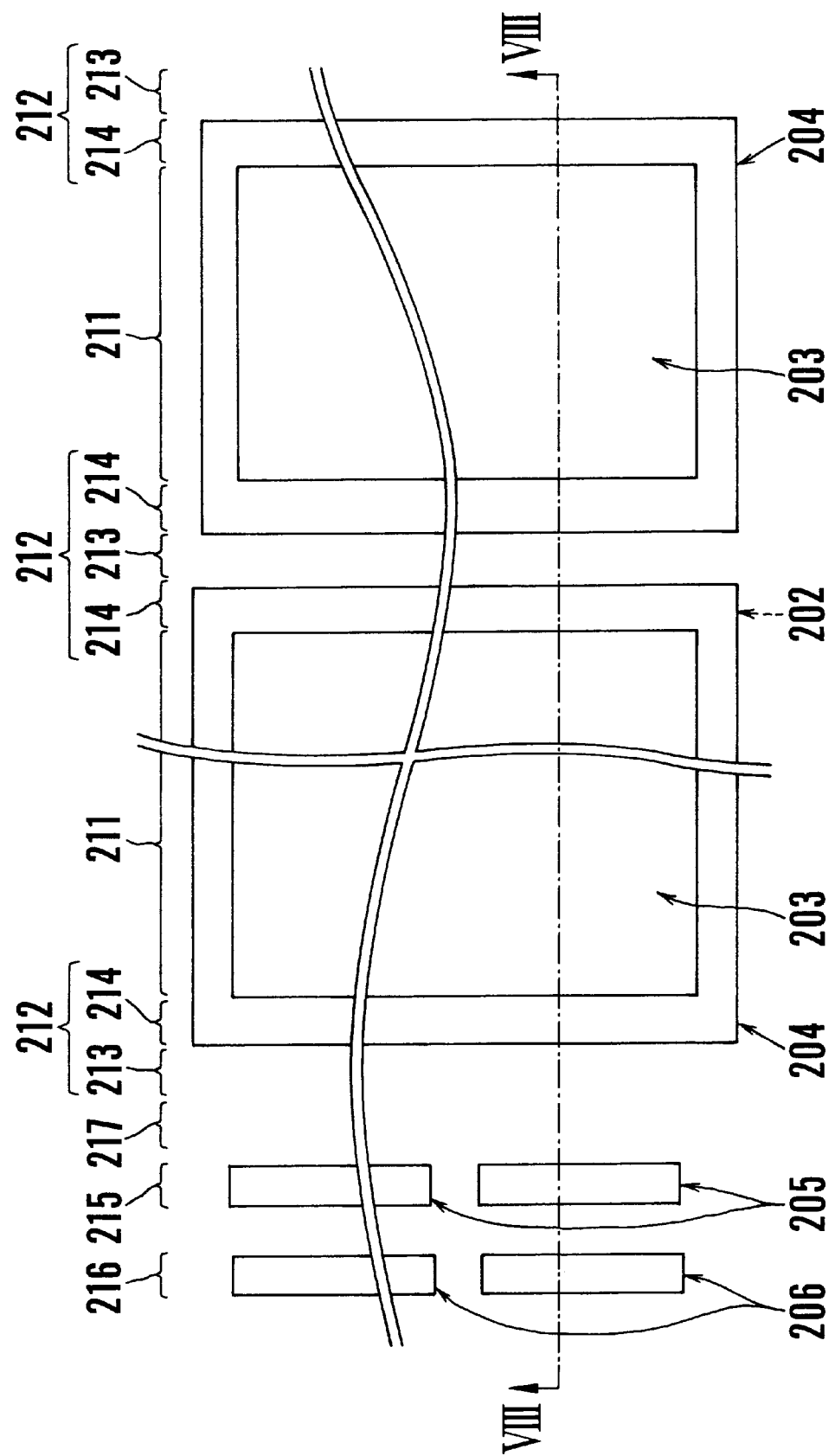
FIG. 7 is a plan view showing the layout of the second embodiment of the present invention.
Figure 8:
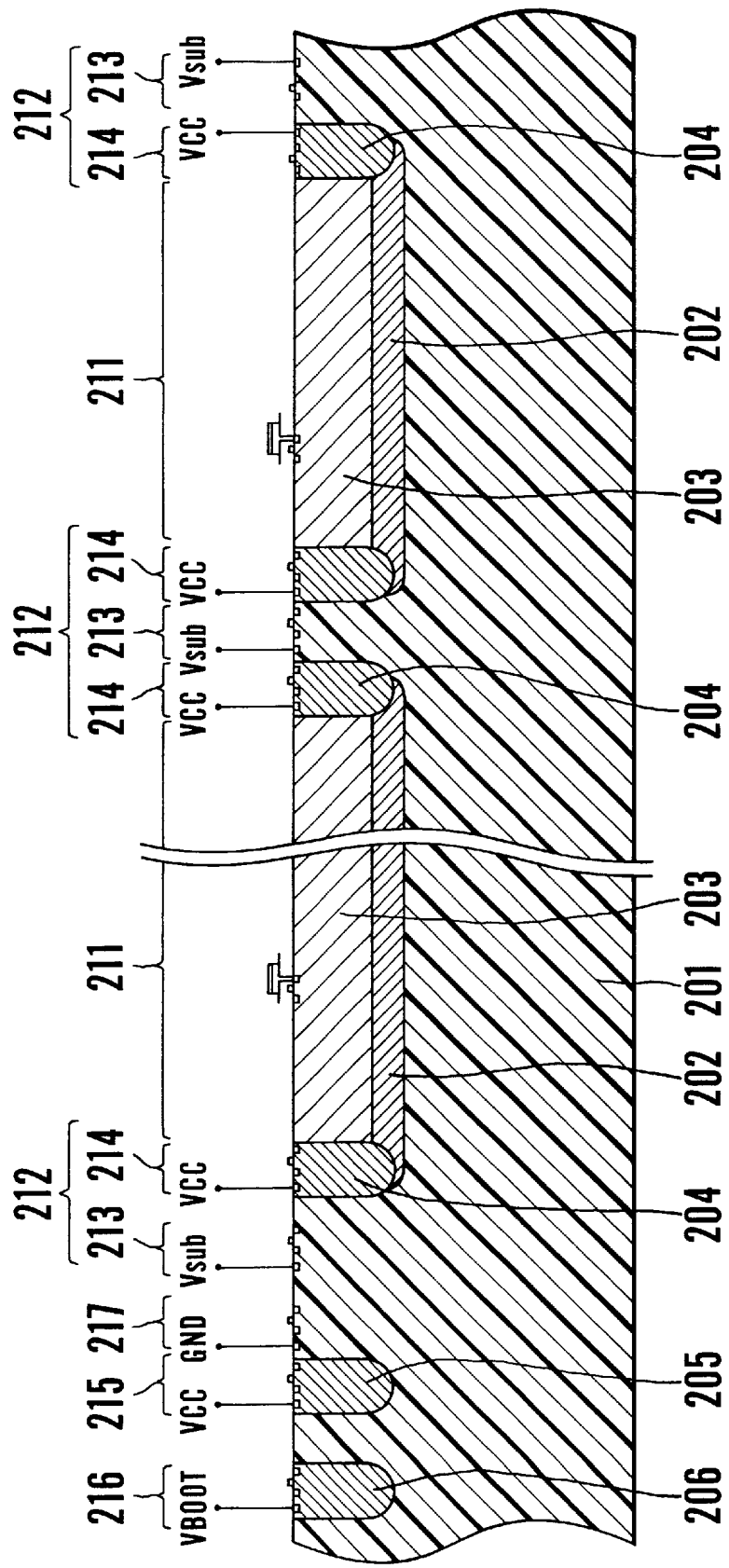
FIG. 8 is a sectional view taken along a line VIII—VIII in FIG. 7.

The second embodiment of the present invention will be described next. FIGS. 7 and 8 are a plan view of the second embodiment of the present invention and a sectional view taken along a line VIII—VIII therein. Referring to FIGS. 7 and 8, deep N-type wells 202 are formed in a plurality of portions of the cell array formation region of a P-type semiconductor substrate 201, and P-type wells 203 are formed in the N-type wells 202. Isolation N-type wells 204 reaching the deep N-type wells 202 are formed along the peripheries of the P-type wells 203. The P-type wells 203 are isolated from the semiconductor substrate 201 through the isolation N-type wells 204. In this embodiment, each of the P-type wells 203 is isolated by a corresponding one of the isolation N-type wells 204. A memory cell 211 is formed in each P-type well 203.

A sense amplifier 212 is formed over the isolation N-type well 204 and an outer peripheral region of the semiconductor substrate 201. This sense amplifier 212 is constituted by one NMOS element 213 made of an NMOS transfer gate, an NMOS chip select gate, an NMOS flip-flop, or the like, and two PMOS elements 214 made of PMOS flip-flops adjacent to the NMOS element 213. The PMOS elements 214 are formed in the isolation N-type well 204. The NMOS element 213 is formed in the region, of the semiconductor substrate 201, which is adjacent to the N-type well 204.

As in the first embodiment, N-type wells 205 and 206 are formed in the region, of the semiconductor substrate 201, which is adjacent to the PMOS element 214. A PMOS element 215 as a peripheral circuit of a power supply VCC is formed in the N-type well 205, and a PMOS element 216 of a power supply VBOOT is formed in the N-type well 206. In addition, an NMOS element 217 as a peripheral circuit is directly formed on the region, of the semiconductor substrate 201, which is adjacent to the NMOS element 213.

In the second embodiment as well, since the PMOS elements 214 are formed in the isolation N-type wells 204 to isolate the P-type wells 203 from the semiconductor substrate 201, the isolation N-type wells 204 can be effectively used. A high integration degree can therefore be realized. In addition, in this embodiment, since the NMOS element 213 is formed on the semiconductor substrate 201, the entire region of the P-type well 203 can be formed as a memory cell. This structure is therefore effective at increasing the memory cell capacity of the semiconductor memory device.

What is claimed is:

1. A semiconductor memory device, comprising:

(a) a deep well of a second conductivity type formed in a semiconductor substrate of a first conductivity type;

(b) a cell array well of the first conductivity type formed on said deep well;

(c) an isolation well of the second conductivity type formed around said cell array well and contiguous with said deep well so as to isolate said cell array well from said semiconductor substrate;

(d) a circuit element, for driving a cell array, formed in said isolation well;

(e) a memory cell and a second conductivity type channel element of a sense amplifier circuit formed in said cell array well on one side thereof;

(f) a first conductivity type channel element of said sense amplifier circuit formed in said isolation well on one side thereof;

(g) another second conductivity type channel element of another sense amplifier circuit formed in said cell array well on another side thereof; and (h) another first conductivity type channel element of said another sense amplifier circuit formed in said isolation well on another side thereof;

wherein an arrangement of said first conductivity type channel element and said second conductivity type channel element on said one side is reversed to an arrangement of said another first conductivity type channel element and said another second conductivity type channel element on said another side.

2. A device according to claim 1, wherein at least another well of the second conductivity type is formed in a region of said semiconductor substrate which is located outside said isolation well, a first conductive channel type element of a peripheral circuit is formed in said another well, and a second conductive channel type element of a peripheral circuit is formed in a region of said semiconductor substrate which is adhacent to said another well.

3. A semiconductor memory device, comprising:

(a) a deep well of a second conductivity type formed in a semiconductor substrate of a first conductivity type;

(b) a cell array well of the first cypeonductivity type formed on said deep well;

(c) an isolation well of the second conductivity type formed around said cell array well and contiguous with said deep well so as to isolate said cell array well from said semiconductor substrate;

(d) a circuit element, for driving a cell array, formed in said isolation well;

(e) a memory cell formed in said cell array well;

(f) a first conductivity type channel element of a sense amplifier circuit formed in said isolation well on one side thereof; and (g) a second conductivity type channel element of said sense amplifier circuit formed in a region of said semiconductor substrate on one side thereof which is located outside and in the vicinity of said isolation well;

(h) another second conductivity type channel element of another sense amplifier circuit formed in another region of said semiconductor substrate on another side thereof which is located outside and in the vicinity of said isolation well; and (i) another first conductivity type channel element of said another sense amplifier circuit formed in saide isolation well on another side thereof;

wherein an arrangement of said first conductivity type channel element and said second conductivity type channel element on said one side is reversed to an arrangement of said another first conductivity type channel element and said another second conductivity type channel element on said another side.

4. A device according to claim 3, wherein at least another well of the second conductivity type is formed in a region of said semiconductor substrate which is located outside said isolation well, a first conductive type channel element of a peripheral circuit is formed in said another well, and a second conductive type channel element of a peripheral circuit is formed in a region of said semiconductor substrate which is adjacent to said another well.

* * * * *